United States Patent [19]
Wiedeman et al.

[11] Patent Number: 5,230,746
[45] Date of Patent: Jul. 27, 1993

[54] PHOTOVOLTAIC DEVICE HAVING ENHANCED REAR REFLECTING CONTACT

[75] Inventors: Scott Wiedeman, Langhorne; Frederick R. Jackson, Philadelphia, both of Pa.

[73] Assignee: Amoco Corporation, Chicago, Ill.

[21] Appl. No.: 845,205

[22] Filed: Mar. 3, 1992

[51] Int. Cl.$^5$ ............... H01L 31.052; H01L 31/075; H01L 31/18

[52] U.S. Cl. .................. 136/249; 136/256; 136/258; 136/259; 437/2; 437/4

[58] Field of Search ......... 136/249 TJ, 256, 258 AM, 136/259, 246; 437/2-5

[56] References Cited

U.S. PATENT DOCUMENTS

| | | | |
|---|---|---|---|
| 4,166,919 | 9/1979 | Carlson | 136/257 |
| 4,167,015 | 9/1979 | Hanak | 136/255 |
| 4,272,641 | 6/1981 | Hanak | 136/249 TJ |
| 4,400,577 | 8/1983 | Spear | 136/259 |
| 4,419,533 | 12/1983 | Czubatyj et al. | 136/259 |
| 4,442,310 | 4/1984 | Carlson et al. | 136/256 |
| 4,497,974 | 2/1985 | Deckman et al. | 136/259 |
| 4,554,727 | 11/1985 | Deckman et al. | 437/2 |
| 4,663,495 | 5/1987 | Berman et al. | 136/248 |
| 4,818,337 | 4/1989 | Barnett et al. | 156/659.1 |
| 4,849,029 | 7/1989 | Delahoy | 136/249 TJ |
| 4,865,999 | 9/1989 | Xi et al. | 437/2 |
| 4,872,925 | 10/1989 | McMaster | 136/244 |
| 4,880,664 | 11/1989 | O'Dowd | 427/109 |
| 5,057,163 | 10/1991 | Barnett et al. | 136/258 |
| 5,136,351 | 8/1992 | Inoue et al. | 357/30 |

FOREIGN PATENT DOCUMENTS

| | | | |
|---|---|---|---|
| 1-106472 | 4/1989 | Japan | 136/259 |
| 2-180081 | 7/1990 | Japan | 136/259 |
| 2-218177 | 8/1990 | Japan | 136/259 |

Primary Examiner—Aaron Weisstuch
Attorney, Agent, or Firm—F. J. Sroka; T. W. Tolpin

[57] ABSTRACT

A photovoltaic device includes a rear reflecting conductive contact layer adjacent an active semiconductor layer. The rear layer is composed of a light transmissive conductive layer formed on the active layer, an intermediate layer formed on the light transmissive conductive layer, and a layer of light reflecting conductive material formed on the intermediate layer. The intermediate layer includes a dielectric material and portions through which the adjacent light transmissive and light reflecting conductive layers are conductively connected. For example, the intermediate layer can be provided as a thin layer of substantially only a dielectric material or as a cermet.

21 Claims, 2 Drawing Sheets

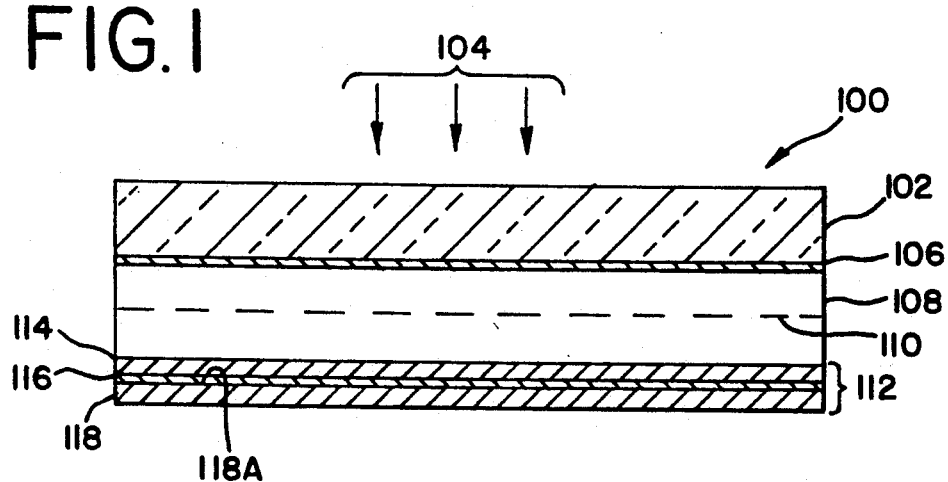
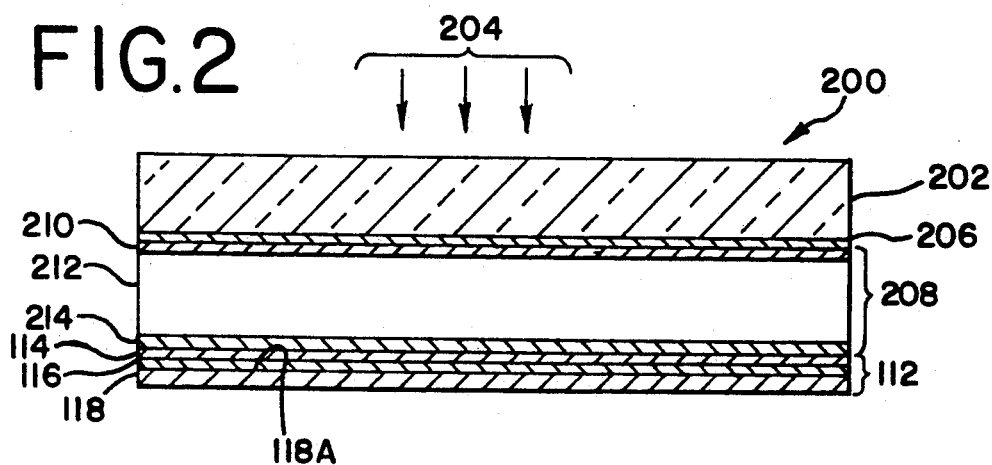
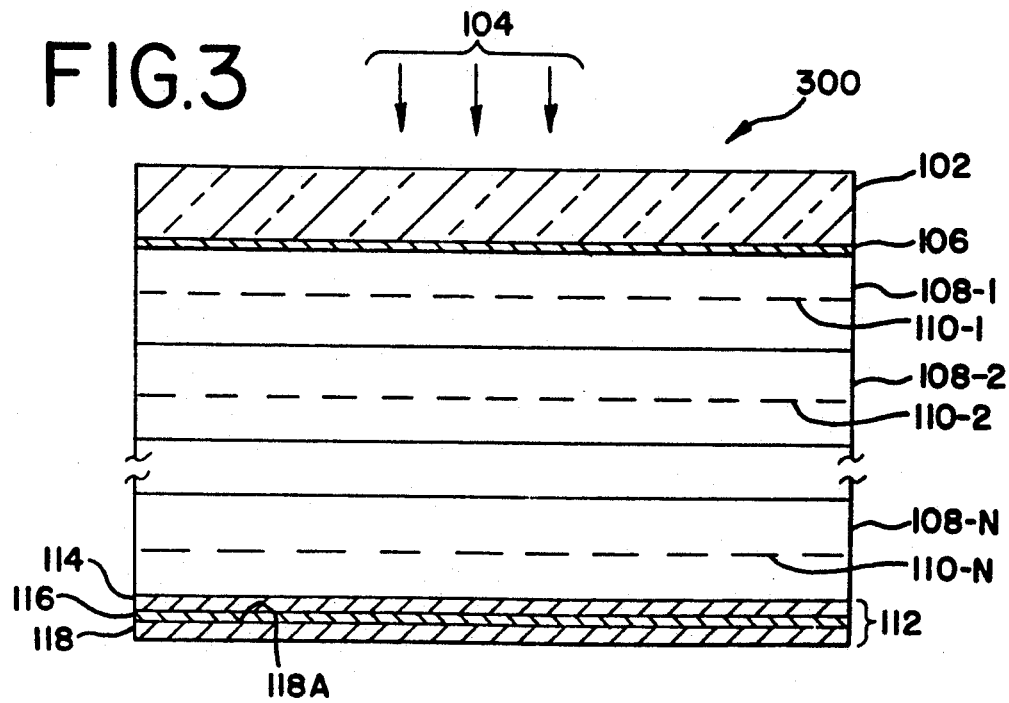

PHOTOVOLTAIC DEVICE HAVING ENHANCED REAR REFLECTING CONTACT

BACKGROUND OF THE INVENTION

Field of the Invention

The present invention relates in general to photovoltaic devices and, more particularly, to photovoltaic devices which include a rear reflecting contact for increasing optical absorption in an active layer of the device.

Description of the Related Art

In accordance with one conventional construction, photovoltaic devices have an active semiconductor layer, a light transmissive front electrical contact through which incident light passes prior to passing through the active semiconductor layer, and a rear reflecting electrical contact which reflects light after it has passed through the active layer. In its conventional form, the rear contact either includes or consists solely of a reflecting conductive material to reflect light back through the active layer to thereby increase the amount of light absorbed and, therefore, the conversion efficiency of the photovoltaic device.

Disadvantageously, rear reflecting contacts currently known in the art do not reflect light efficiently. For example, in a photovoltaic device studied by the present inventors, in which the active layer comprises an amorphous silicon body, a rear reflecting contact consisting of a layer of silver (Ag) and a light transmissive layer of indium tin oxide (ITO) interposed between the active layer and the silver layer, i.e., an ITO/Ag rear contact, provides a reflectivity of approximately 70-75% for light in a wavelength range of 600-1000 nm. It is the present inventors' further experience that a rear reflecting contact consisting of only a layer of aluminum provides a reflectivity equivalent or inferior to that of the ITO/Ag rear contact.

U.S. Pat. No. 4,497,974 to Deckman et al. discloses an optically enhanced solar cell in which a rear reflector is detached and spaced away from a layer of semiconductor material by a thick layer, i.e., more than 0.15 μm, of dielectric material. This construction is intended to provide improved optical performance. However, all current generated by the cell must then be carried by a rear contact which is provided as a transparent electrical contact, i.e., a layer of transparent conductive material, interposed between the semiconductor layer and the dielectric layer. No current is carried by the rear reflector, since the dielectric layer electrically isolates the rear reflector. In a device having such a construction, it is therefore necessary to assure that the transparent rear contact is provided with a conductivity sufficient to minimize power loss. For example, in the patent to Deckman et al. it is suggested that, depending on the sheet conductivity of the transparent electrical contact, it may be desirable to cover the transparent contacts with a fine line metallic grid.

SUMMARY OF THE INVENTION

The present invention has been made in view of the above circumstances and has as an object to provide a photovoltaic device including a rear reflecting contact structure in which reflectivity is maximized, so that optical absorption at the rear contact is minimized.

Another object of the invention is to provide a photovoltaic device including a rear reflecting contact structure in which reflectivity is maximized while the conductivity of the rear contact structure is sufficient to minimize power loss.

Additional objects and advantages of the invention will be set forth in part in the description which follows and in part will be obvious from the description, or may be learned by practice of the invention. The objects and advantages of the invention may be realized and attained by means of the instrumentalities and combinations particularly pointed out in the appended claims.

To achieve the objects and in accordance with the purpose of the invention, as embodied and broadly described herein, the photovoltaic device of the invention comprises a layer of semiconductor material including a semiconductor junction, the semiconductor layer having first and second opposing major surfaces; a first optically transmissive electrically conductive contact layer disposed o the first major surface through which incident light enters the semiconductor layer; and an optically reflective electrical contact layer disposed on the second major surface of the semiconductor layer. The optically reflective electrical electrically conductive contact layer disposed on the second major surface of the semiconductor layer, an optically transmissive intermediate layer including a dielectric material disposed on the second optically transmissive contact layer, and a layer of electrically conductive, optically reflective material disposed on the intermediate layer. The intermediate layer includes portions through which the second optically transmissive conductive layer and the optically reflective conductive layer are conductively connected.

The invention is also directed to a method for forming a photovoltaic device. The method comprises steps of providing an optically transparent substrate, depositing a first optically transmissive electrically conductive contact layer on the substrate, depositing on the first contact layer a layer of semiconductor material including a semiconductor junction, and depositing on the layer of semiconductor material a second optically transmissive electrically conductive contact layer. The method also includes steps of depositing on the second contact layer an optically transmissive intermediate layer including a dielectric material and depositing a layer of electrically conductive, optically reflective material on the intermediate layer. The intermediate layer is deposited to include portions through which the second contact layer and the optically reflective layer are conductively connected.

BRIEF DESCRIPTION OF THE DRAWINGS

The accompanying drawings, which are incorporated in and constitute a part of this specification illustrate embodiments of the invention and, together with the description, serve to explain the objects, advantages, and principles of the invention. In the drawings FIG. 1 is a cross-sectional view of a photovoltaic device constructed in accordance with the present invention;

FIG. 2 is a cross-sectional view of an amorphous silicon photovoltaic device constructed in accordance with the present invention;

FIG. 3 is a cross-sectional view of a multijunction photovoltaic device constructed in accordance with the present invention.

DETAILED DESCRIPTION OF THE PREFERRED EMBODIMENTS

Figure 4:
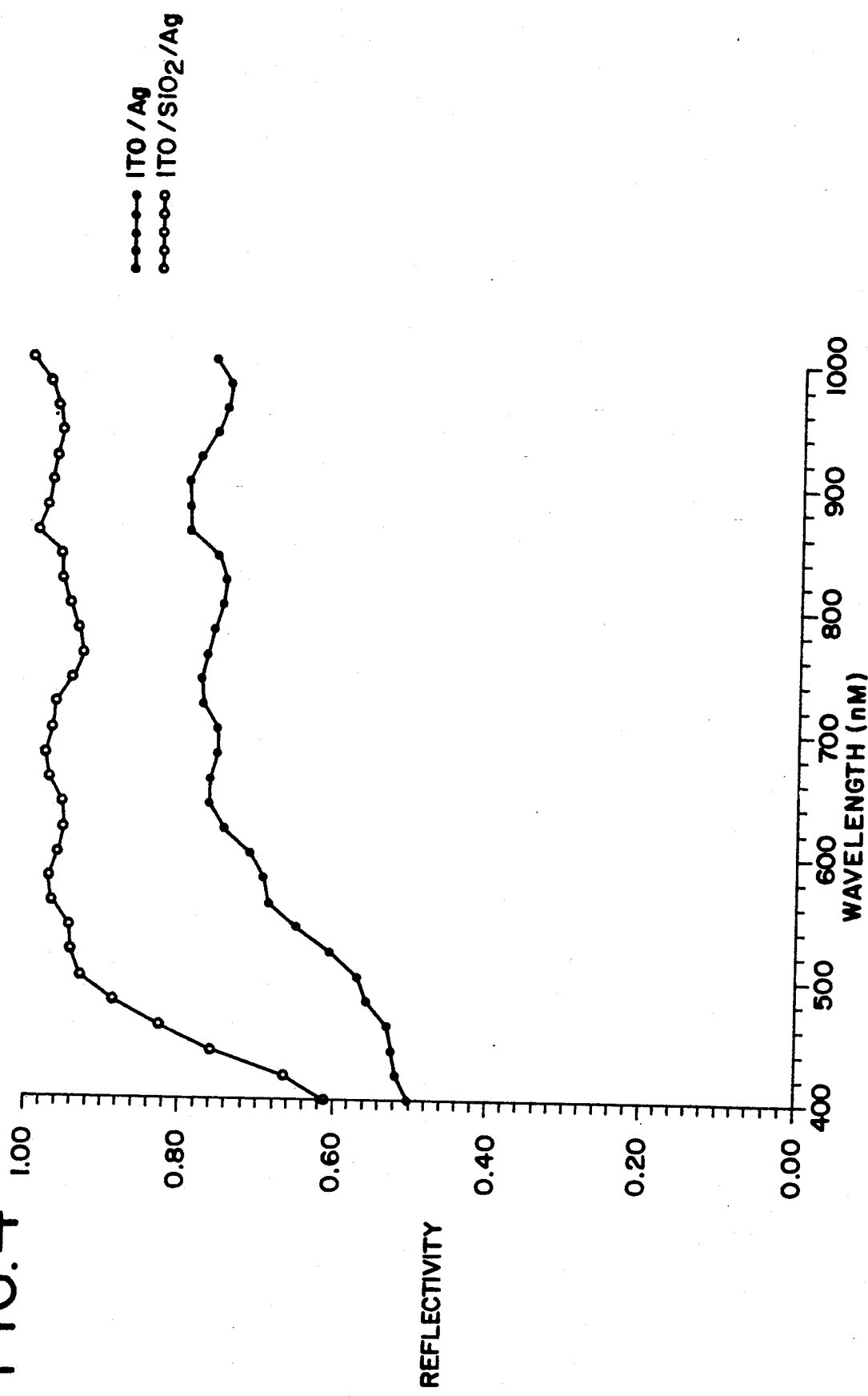
FIG. 4 is a graph illustrating a plot of reflectivity as a function of wavelength for showing an enhanced

Referring now to the drawings, FIG. 1 illustrates a photovoltaic device 100 constructed in accordance with an embodiment of the invention. Device 100 includes a light transmissive substrate 102, such as glass, which receives incident light 104. As used herein, incident light is not limited to visible light and includes electromagnetic radiation in a wavelength range useful for photovoltaic conversion, especially in a range of 300–1200 nm. Also as generally used herein, the phrase "light transmissive" is intended to characterize an element as being substantially optically transparent to electromagnetic radiation in the useful wavelength range.

A front conductive contact layer 106 is formed on substrate 102. Front contact layer 106 is preferably provided as a light transmissive conductor such as a metal oxide, e.g., tin oxide or indium tin oxide (ITO). It is noted that the front contact layer can be provided as a light transmissive metal grid, such as when the active layer of the device is a single crystal or polycrystalline semiconductor material.

Although not essential to the practice of the present invention, it is further preferred that front contact layer 106 be provided with a textured surface to scatter light passing therethrough to enhance optical absorption in the active layer of the device. A method for forming layer 106 with a textured surface is disclosed in commonly assigned U.S. Pat. No. 4,880,664 which is incorporated in its entirety herein by reference.

An active layer of semiconductor material 108, including a semiconductor junction 110, is formed on contact layer 106. Semiconductor layer 108 can be provided in crystalline or amorphous form in any of numerous different configurations known in the art. For example, layer 108 can include a semiconductor material such as gallium arsenide, indium phosphide, cadmium sulfide, cadmium telluride, copper-indium-diselenide, or gallium-aluminum arsenide. Further, layer 108 can include single crystal or polycrystalline silicon, or hydrogenated amorphous silicon based semiconductors such as hydrogenated amorphous silicon germanium or hydrogenated amorphous silicon carbide. An embodiment of device 100 in which layer 108 is provided as a body of hydrogenated amorphous silicon is described more fully below.

Semiconductor junction 110 can be any type of barrier which causes electron-hole pairs, generated by the absorption of light in the active layer, to separate and flow in opposite directions. The flow of electrons and holes creates the photovoltage and photocurrent of the photovoltaic cell. For example, junction 110 can be a p-n junction with the portions of active layer 108 on opposite sides of junction 110 being of opposite conductivity types.

In the case in which layer 108 is provided as a body of amorphous silicon, layer 108 is doped to have either a p-i-n (i.e., p-type, intrinsic, n-type) or n-i-p structure, in which an electric field is formed across the intrinsic layer, in a manner well known in the art. In the p-i-n or n-i-p structure, electron-hole pairs are generated primarily in the intrinsic layer by absorption of light. The generated electrons and holes separate and move toward the n- and p-layers, respectively, under the influence of the electric field.

Device 100 further includes a rear light reflecting conductive contact layer 112 constructed in accordance with the present invention. Layer 112 is composed of layers 114, 116 and 118. Layer 114 is formed on semiconductor layer 108 and is provided as a light transmissive conductor such as a conductive oxide, e.g., tin oxide, ITO, or ZnO. Layer 114 is preferably provided as a layer of ZnO which is textured as a result of its conformance to a texture of layer 108 which, in turn, is textured as a result of its conformance to the texture of layer 106. It is noted that the provision of layer 114 as a textured layer is not essential to the successful practice of the invention. Layer 116 is an intermediate layer which includes a dielectric material and which is deposited on layer 114. Layer 118 is provided as a reflecting conductive material which is preferably silver, although layer 118 can also be provided as aluminum, copper, or any other metal or alloy which has a high optical reflectivity when applied to dielectric layer 116.

The present inventors believe that the degraded reflectivity of a rear reflecting contact in a conventional device in which the rear contact consists of a conductive oxide and a reflecting conductive material, is due to the formation of an oxide film on the reflecting conductive material, such an oxide film being formed due to scavenging of oxygen from the conductive oxide. For example, with respect to the above-noted conventional ITO/Ag construction of the rear contact, the present inventors believe that oxygen is scavenged from the ITO layer to form a silver oxide film on the Ag layer. The silver oxide film is optically absorbing and thereby degrades the reflectivity of the rear contact.

In accordance with the present invention, layer 116 is provided to substantially prevent a reduction of the reflectivity of the rear reflecting contact structure. Layer 116, being interposed between layer 114 and layer 118, substantially blocks chemical interaction between layers 114 and 118, e.g., the scavenging of oxygen from layer 114 and thus inhibits the formation of an optically absorptive film, e.g., an oxide, on a reflecting surface 118A of reflecting layer 118 which would otherwise reduce the reflectivity of the rear contact structure. As a result, the reflectivity of rear contact layer 112 is substantially maximized.

However, in order to assure that rear contact layer 112 has a sufficiently high conductivity in order to minimize power losses therein, intermediate layer 116 is deposited to include dispersed portions through which layers 114 and 118 are conductively connected. As a result, charge carriers generated in active layer 108 and collected at the surface of conductive oxide layer 114 are conducted to a terminal point (not shown), for collection by a user, by layer 114 and also by layer 118 via its conductive connections to layer 114 through the dispersed portions of layer 116.

In accordance with one embodiment of the invention, layer 116 is provided as a thin layer composed of substantially only a dielectric material deposited on layer 114. In the case in which layer 116 is provided as composed substantially only of a dielectric material, it is preferred that the dielectric material be $SiO_2$. However, other dielectric materials may be substituted for $SiO_2$ and include SiO, $Si_3N_4$, SiC, $Al_2O_3$, silicon oxynitride, BN, amorphous carbon, and transparent polymers such as polyimide, methyl methacrylate, etc., or combinations of such polymers.

In this embodiment, in which layer 116 is composed substantially only of a dielectric material, the layer must be deposited to be sufficiently thin to assure that it is light transmissive and that it is discontinuous. More particularly, when layer 116 is composed substantially only of a dielectric material, it is deposited to be sufficiently thin to be discontinuous so as to include dispersed openings which constitute electrically conductive paths through which layers 114 and 118 are electrically conductively connected. Alternately, or additionally, the dielectric layer should be at least thin enough to allow conduction via a tunneling mechanism between layers 114 and 118. For example, when layer 116 is provided as a layer of $SiO_2$, the present inventors have observed that by depositing the layer with a sufficiently small thickness, the layer is discontinuous in that it includes pinhole-like openings formed through its thickness and dispersed over the area of the layer. Electrically conductive contact between layers 114 and 118 is achieved through the pinhole-like openings in layer 116. However, the interposition of layer 116 between layers 114 and 118 nevertheless substantially inhibits chemical interaction between layers 114 and 118, including the formation of an optically absorptive oxide on the reflecting surface of layer 118. As a result, the reflectivity of layer 112 is substantially maximized without degrading its conductivity. In accordance with a preferred practice of this embodiment of the invention, layer 116 composed substantially only of a thin layer of dielectric material has a thickness of less than approximately 250 Å.

In accordance with another embodiment of the invention, intermediate layer 116 is provided as a matrix material composed of a conductive material such as a metal, dispersed in the dielectric material. In this embodiment, layer 116 is preferably provided as a cermet which, as is known in the art, is a composite material consisting of finely dispersed mixtures of immiscible metals and dielectric materials.

The metal dispersed in the cermet constituting layer 116 includes portions which serve as conductive paths which electrically conductively connect layers 114 and 118. Thus, layer 116 provided as a cermet provides conductive contact between layers 114 and 118, while also substantially inhibiting chemical interaction between layers 114 and 118 including the formation of an optically absorptive oxide on the reflecting surface of layer 118.

Cermets which the present inventors believe to be suitable for deposition as layer 116 include a mixture of chromium and silicon monoxide (Cr/SiO), or other metals mixed with dielectric materials such as $SiO_2$, SiO, $Si_3N_4$, $TiO_2$, $Al_2O_3$, BN, or $Si_xO_yN_z$. Also suitable for deposition as layer 116 are the cermets disclosed in U.S. Pat. No. 4,167,015 to Hanak, which is incorporated in its entirety herein by reference. The thickness of the cermet layer is constrained to be sufficiently thin to assure it is light transmissive. Therefore, the actual thickness of the cermet layer varies in accordance with the particular cermet selected for use. In the case where layer 116 is composed of a Cr/SiO cermet, a thickness of approximately 100 Å is suitable for the practice of the present invention. The above incorporated U.S. Pat. No. 4,167,015 discloses suitable methods for the deposition of a cermet.

In the operation of device 100, incident light 104 generates electron-hole pairs in active layer 108. The generated electrons and holes separate and flow in opposite directions for collection at contact layers 106 and 112. The carriers collected at layer 112 are conducted for collection, by the user, by both layers 114 and 118 due to the conductive connection between those layers through intermediate layer 116. As a result, good electrical conductivity at rear contact layer 112 is maintained.

Also, incident light 104 which is not absorbed after passing through layers 102-108 is reflected from the reflecting surface of layer 118 such that the reflected light passes through active layer 108 multiple times to generate additional charge carrier pairs. Since the reflectivity of rear contact layer 112 is substantially maximized due to the interposition of layer 116, a substantial portion of the incident light is reflected by layer 118. As a result, device 100 experiences improved optical absorptivity and efficiency.

FIG. 2 illustrates a photovoltaic device 200 constructed in accordance with the present invention and including an active semiconductor layer comprising a body of hydrogenated amorphous silicon. Device 200 includes a glass substrate 202, which receives incident light 204, a light transmissive front contact 206 deposited on substrate 202, and an active semiconductor layer 208, provided as a body of hydrogenated amorphous silicon, deposited on layer 206. As in the case of device 100, front contact 206 can be provided as a transparent conductive metal oxide, such as tin oxide, ITO, or ZnO. Also as in the case of device 100, layer 206 is preferably deposited to have a textured surface.

Layer 208 includes layers 210, 212, and 214 of hydrogenated amorphous silicon, of which layer 212 is an intrinsic layer and layers 210 and 214 are respectively doped to have opposite conductivity types. Thus, layer 208 can constitute a p-i-n structure in which layers 210 and 214 are respectively doped to be p-type and n-type, so that the incident light first passes through the p-layer. Alternatively, layer 208 can constitute an n-i-p structure in which layers 210 and 214 are respectively doped to be n-type and p-type, so that the incident light first passes through the n-layer. Carbon can be added to either or both doped layers 210 and 214 to reduce optical absorption therein, and thereby improve the performance of device 200.

Device 200 further includes rear light reflective conductive contact layer 112 constructed in accordance with the present invention to include layers 114, 116, and 118 having any one of the constructions described above for device 100.

In the operation of device 200, incident light 204 generates pairs of charge carriers in intrinsic layer 212 and the carriers are separated under the influence of an electric field induced by layers 210 and 214. The separated carriers are respectively collected at front contact 206 and rear contact layer 114. The carriers collected at layer 114 are conducted for collection by both layers 114 and 118 due to the conductive connection between those layers through intermediate layer 116. As a result, power losses due to conduction by rear contact layer 112 are minimized.

Incident light 204 which is not absorbed after passing through layers 202-208 is reflected from the reflecting surface of layer 118 such that the reflected light passes through intrinsic layer 212 multiple times. Since the reflectivity of layer 112 is substantially maximized, a substantial portion of the incident light is reflected by layer 118. As a result, device 200 experiences improved optical absorptivity and efficiency.

A method by which an exemplary device 200 was actually constructed is described next. Glass substrate 202 was provided as a layer of Corning ® type 7059 glass having a thickness of approximately 1 mm. Front contact layer 206 was provided as a layer of textured tin oxide having a thickness of approximately 6000 Å and a sheet resistivity of approximately 20 ohms/square. Layer 206 was formed using atmospheric chemical vapor deposition with tin tetrachloride, hydrogen fluoride, water, and methanol as precursors in a nitrogen carrier gas. Greater detail for deposition of a textured tin oxide layer is provided in the above-incorporated U.S. Pat. No. 4,880,664.

Next, active semiconductor layer 208 was deposited on layer 206 as a layer of amorphous silicon doped to have a p-i-n structure. The p-i-n structure was deposited in a high vacuum, mechanically pumped, DC plasma-enhanced chemical vapor deposition system of the parallel plate type, with substrate 202 and layer 206 grounded. High purity silane was used at a pressure of 500 milliTorr, 200 standard cubic centimeters per minute (sccm) total flow in the DC plasma discharge to deposit the p-, i-, and n-type semiconductor layers. Small amounts of diborane and phosphine gas were added for doping of the p- and n-layers, respectively. With respect to the p-layer, a mixture of silane and methane (concentration of 30%) was used to deposit the p-layer as amorphous hydrogenated silicon carbide (a-SiC:H). The p-i-, and n-layers were deposited at rates of about 6 Å/second, 4 Å/second, and 5 Å/second, respectively, to provide layer thicknesses of 100 Å, 6000 Å, and 200 Å, respectively. During deposition of the p-, i-, and n-layers, a substrate temperature of 260° C. was maintained.

Rear contact layer 112, including layers 114, 116, and 118, was formed next. Layer 114 was deposited by reactive evaporation as an ITO layer having a thickness of approximately 700 Å. The ITO layer was electron-beam evaporated from a solid source of ITO pellets in a crucible, oxygen pressure of $2 \times 10^{-4}$ Torr, at a rate of about 1 Å/second, and with a substrate temperature of 210° C.

Layer 116 was deposited by electron-beam evaporation as a layer of SiO$_2$ having a thickness of approximately 100 Å. The SiO$_2$ of layer 116 was electron-beam evaporated from a solid source in a graphite crucible with no gas flowing at a pressure of $1 \times 10^{-6}$ Torr, or lower, and a substrate temperature of 30° C. or less. Under these conditions, deposition occurred at a rate of approximately 4 to 10 Å/second.

Layer 118 was deposited as a layer of Ag by electron-beam evaporation from a solid source in a crucible, with no gas flowing at a pressure of $1 \times 10^{-6}$ Torr, or lower, at a rate of 10 Å/second, and a substrate temperature of about 30° C. The deposition of Ag was conducted so that the total thickness of layer 118 was approximately 2000 Å.

Upon completion of construction, the entire photovoltaic device is subjected to heat treatment in air at approximately 190° C. for 30 to 60 minutes. Such heat treatment has been found to enhance the optical and electrical properties of the ITO layer.

While the above described method for forming rear contact layer 112 includes deposition of the thin layer 116 of dielectric material by electron-beam evaporation, it will now be apparent to those skilled in the art that the layer of dielectric material can be deposited by other techniques. For example, layer 116 provided as a thin layer of dielectric material of the type described above can also be deposited by sputtering, thermal evaporation, chemical vapor deposition, or plasma enhanced chemical vapor deposition.

FIG. 3 illustrates a multijunction photovoltaic device 300 constructed in accordance with the present invention and including a plurality of two or more active layers 108-1, 108-2, ..., 108-N stacked on top of each other. As a result, the multiple active layers 108-i are both electrically and optically in series. Layers 108-1, 108-2, ..., 108-N respectively include junctions 110-1, 110-2, ..., 110-N. An exemplary construction of a multijunction photovoltaic device, also known in the art as a tandem junction device, is disclosed in U.S. Pat. No. 4,272,641 to Hanak, which is incorporated herein by reference. Another construction of a multijunction photovoltaic device is disclosed in commonly assigned, copending patent application Ser. No. 07/730,177, entitled "Multijunction Photovoltaic Device and Fabrication Method." Except for the inclusion of the plurality of layers 108-i, the construction of device 300 is identical to the construction of device 100. In particular, device 300 also includes rear light reflective contact layer 112 constructed in accordance with the present invention, including layers 114, 116, and 118.

In the operation of device 300, the incident light causes generation of carriers in the active layers. The carriers are separated and collected at contact layers 106 and 112, as previously described. Also as previously described, device 300 realizes minimal power loss due to the conductive contact between layers 114 and 118 and improved efficiency due to the substantially maximized reflectivity of layer 112.

FIG. 4 is a graph on which is plotted a characteristic of reflectivity of a rear reflecting contact as a function of incident light wavelength over a range of wavelengths of interest in photovoltaic cell applications. In particular, the upper curve represents the reflectivity of a rear reflecting contact in a first test sample composed of layers 114, 116, and 118 provided as ITO, SiO$_2$ and Ag, respectively, deposited on a substrate consisting of layers 102 and 106 provided as Corning ® 7059 glass and textured tin oxide, respectively. Thus, the first test sample did not include an active semiconductor layer. The lower curve in FIG. 4 represents the reflectivity of a rear reflecting contact of a second test sample with the same construction as the first test sample except there was no layer of SiO$_2$ between the ITO and Ag layers.

With respect to the contact structures represented by the upper and lower curves in FIG. 4, the layers of Ag, SiO$_2$, and ITO were deposited by the methods and with the approximate thicknesses described above with respect to the method for constructing exemplary device 200. The test sample corresponding to the upper curve contained the same layers as described for the actually constructed exemplary device 200, except that active layer 208 was omitted. As a result, the ITO layer of the rear contact was deposited directly on the tin oxide front contact layer. The test sample corresponding to the lower curve contained the same layers as the sample corresponding to the upper curve except for the further omission of the SiO$_2$ layer in the rear reflecting contact. As a result, with respect to both samples during the test of reflectivity, the incident light passed through glass substrate 202 and textured front contact layer 206 and was reflected by the rear reflecting contact structure. The samples were constructed without active layer 208 in order to eliminate optical absorption that would otherwise occur in the active layer, in order to provide a more accurate measurement of reflectivity. Each sample was heat treated in air at approximately 190° C. for approximately 30 minutes prior to testing. Such heat treatment is believed to enhance the optical transmissivity of the ITO layer. Both the upper and lower curves in FIG. 4 are corrected for optical trapping in the glass-/textured conductive oxide structure.

As seen in FIG. 4, the rear contact layer constructed in accordance with the present invention has a substantially improved reflectivity in a range of wavelengths of interest for photovoltaic devices. As seen in FIG. 4, portions of the upper curve appear to exceed a reflectivity of 1.00. This is a result of the corrections made for optical trapping.

EXAMPLE 1

Example 1 illustrates the advantages realized from constructing a photovoltaic device including a rear reflecting contact in accordance with the present invention. In this example, four cells #1-#4 were constructed. All four cells had a structure generally as described above for device 200 including an amorphous silicon active layer having a p-i-n structure. However, cells #1 and #2 were constructed in accordance with the present invention to provide the rear reflecting contact having an ITO/SiO$_2$/Ag structure. Cells #3 and #4 were constructed with a rear reflecting contact having a ZnO/Ag structure. Further, cells #1 and #3, were constructed from halves of the same substrate, such that the only difference therebetween was the construction of the rear reflecting contact. Similarly, cells #2 and #4 were halves of the same substrate and only differed in the construction of the rear reflecting contact.

With respect to cells #3 and #4, the ZnO layer was deposited using RF magnetron sputtering in argon of a zinc oxide target. The zinc oxide layer is approximately 800 Å thick.

The present inventors believe that, based on performance, a conventional rear reflecting contact constructed with ZnO is slightly superior to a contact constructed with ITO and therefore represents an optimal conventional rear contact. In view of this, cells #3 and #4, which contained the conventional rear contact structure, were constructed with ZnO. Since, as noted below, the performance of cells #1 and #2 was superior to that of cells #3 and #4, the test results show that a cell constructed in accordance with the invention performs better than a cell with the optimal conventional rear contact.

The respective operational performances of cells #1-#4 are listed in Table 1:

TABLE 1

| Cell # | V$_{oc}$ | J$_{sc}$ | F.F. | Q.E. @ 700 nm | Eff |
|---|---|---|---|---|---|
| 1 | 866 | 17.54 | 65.9 | .585 | 10.01 |
| 2 | 868 | 17.43 | 65.9 | .581 | 9.97 |
| 3 | 859 | 17.17 | 64.9 | .559 | 9.57 |
| 4 | 858 | 17.21 | 65.9 | .565 | 9.73 |

In Table 1, V$_{oc}$ is the cell open circuit voltage in millivolts. J$_{sc}$ is the short circuit current circuit density of the cell in mA/square centimeter measured by integration of the quantum efficiency multiplied by the AM1.5 solar spectrum. F.F. is the fill factor in percent. Q.E. is the quantum efficiency at a wavelength of 700 nm. Eff. is the cell efficiency which is computed as the product of V$_{oc}$, J$_{sc}$, and the fill factor.

As seen in Table 1, cells #1 and #2 which each include a rear reflective contact constructed in accordance with the present invention, exhibit improved cell efficiency. The improved efficiency is substantially due to improved short circuit current performance which, in turn, is due to a higher quantum efficiency at long wavelengths, e.g., 700 nm. Such improved quantum efficiency is expected for a device having an improved rear reflecting contact.

EXAMPLE 2

Example 2 illustrates the effect of the thickness of layer 116, provided as a layer of SiO$_2$, on the operational performance of the cell. In Example 2, forty sample photovoltaic cells were studied. Each cell had a structure generally such as described above for device 200 including an amorphous silicon active layer having a p-i-n structure. However, in three cells the rear reflecting contact was constructed to have the conventional ITO/Ag structure. In the remaining 37 cells of Example 2, the rear reflecting contact was constructed to have an ITO/SiO$_2$/Ag construction, in accordance with the present invention, in which the SiO$_2$ layer, corresponding to layer 116, had an approximate thickness of 25 Å, 60 Å, or 260 Å.

The average performance of the cells of Example 2 are listed below in Table 2 as a function of the thickness of the SiO$_2$ layer.

TABLE 2

| Number of Cells | Approx. SiO$_2$ Layer Thickness (Å) | Average Fill Factor | 95% Confidence Interval for Mean Fill Factor | |
|---|---|---|---|---|
| 3 | 0 | 60.37 | 57.79 | 62.94 |
| 17 | 25 | 58.24 | 57.15 | 59.32 |
| 18 | 60 | 58.40 | 57.35 | 59.45 |
| 2 | 260 | 38.95 | 35.80 | 42.10 |

In Table 2, the fill factor has units of percent. The cell performance results listed in Table 2 illustrate that cells having the rear reflecting contact including the SiO$_2$ layer with a thickness of less than 250 Å, exhibit acceptable fill factors. This indicates that the SiO$_2$ layer in these cells is sufficiently thin to provide a conductive contact between the ITO and Ag layers through the SiO$_2$ layer so that the Ag reflective layer conducts collected charge carriers. As a result, as described above, provision of the SiO$_2$ layer enhances the reflectivity of the reflecting layer 118 while not adversely affecting cell performance with respect to conduction of collected charge carriers.

While an embodiment of the present invention has been illustrated and described in which the rear contact layer includes an intermediate layer provided as a thin layer of dielectric material, the invention is not so limited. More generally with respect to this embodiment, the intermediate layer can be provided as a thin layer of inert material which is not chemically reactive with and substantially blocks reaction between the adjacent conductive layers and which is sufficiently thin to provide a suitable light transmissivity and be sufficiently discontinuous to provide conductive contact between the adjacent conductive layers.

The foregoing description of the preferred embodiments and examples of the invention have been presented for purposes of illustration and description. It is not intended to be exhaustive or to limit the invention to the precise form disclosed, and modifications and variations are possible in light of the above teachings or may be acquired from practice of the invention. The embodiments were chosen and described in order to explain the principles of the invention and its practical application to enable one skilled in the art to utilize the invention in various embodiments and with various modifications as are suited to the particular use contemplated. It is intended that the scope of the invention be defined by the claims appended hereto, and their equivalents.

We claim:

1. A photovoltaic device, comprising:
   a layer of semiconductor material including a semiconductor junction, said semiconductor layer having first and second opposing major surfaces;
   a first optically transmissive electrically conductive contact layer disposed on the first major surface through which incident light enters the semiconductor layer;
   an optically reflective electrical contact layer disposed on the second major surface of the semiconductor layer; and
   said optically reflective electrical contact layer including a second optically transmissive electrically conductive contact layer disposed on the second major surface of the semiconductor layer, an optically transmissive intermediate layer including a dielectric material disposed on the second optically transmissive contact layer, and a layer of electrically conductive optically reflective material disposed on the intermediate layer;
   wherein said intermediate layer includes portions through which said second optically transmissive conductive layer and said optically reflective conductive layer are conductively connected.

2. The photovoltaic device of claim 1 wherein said intermediate layer is a thin layer of dielectric material which is discontinuous so as to include openings through which said second optically transmissive conductive layer and said optically reflective conductive layer are conductively connected.

3. The photovoltaic device of claim 1 wherein said intermediate layer is a cermet layer including at least one metal dispersed in the dielectric material, the dispersed metal defining paths through which said second optically transmissive conductive layer and said optically reflective conductive layer ar conductively connected.

4. The photovoltaic device of claim 1 wherein said layer of semiconductor material comprises a plurality of layers of hydrogenated amorphous silicon of respectively different conductivity types, said layers being arranged in a stacked configuration including a top layer having said first major surface, a bottom layer having said second major surface, and a middle layer interposed between said top and bottom layers, said top and bottom layers being doped with dopants of a first and a second conductivity type, respectively.

5. The photovoltaic device of claim 4 wherein said first and second conductivity types are p-type and n-type, respectively, and the middle layer is intrinsic.

6. The photovoltaic device of claim 4 wherein said first and second conductivity types are n-type and p-type, respectively, and the middle layer is intrinsic.

7. The photovoltaic device of claim 1 wherein said layer of semiconductor material comprises a plurality of photovoltaic cells arranged in a stacked configuration, a top cell of the stack including a top layer having said first major surface, a bottom cell of the stack including a bottom layer having said second major surface, each of said plurality of photovoltaic cells including layers o hydrogenated amorphous silicon of respectively different conductivity types.

8. A photovoltaic device, comprising:
   a layer of semiconductor material including a semiconductor junction, said semiconductor layer having first and second opposing major surfaces;
   a first optically transmissive electrically conductive contact layer disposed on the first major surface through which incident light enters the semiconductor layer;
   an optically reflective electrical contact layer disposed on the second major surface of the semiconductor layer; and
   said optically reflective electrical contact layer including a second optically transmissive electrically conductive contact layer disposed on the second major surface of the semiconductor layer, an optically transmissive thin layer of dielectric material disposed on the second optically transmissive contact layer, and a layer of electrically conductive optically reflective material disposed o the thin layer;
   wherein said thin layer is discontinuous so as to include openings through which said second optically transmissive conductive layer and said optically reflective conductive layer are conductively connected.

9. The photovoltaic device of claim 8 wherein the thin layer is a layer of silicon dioxide.

10. The photovoltaic device of claim 9 wherein the silicon dioxide layer has a thickness of less than or equal to 250 Å.

11. The photovoltaic device of claim 9 wherein the silicon dioxide layer has a thickness of less than or equal to 100 Å.

12. The photovoltaic device of claim 9 wherein the silicon dioxide layer has a thickness which is approximately 60 Å.

13. The photovoltaic device of claim 8 wherein the thin layer is composed of a dielectric material selected from the group consisting of SiO, $SiO_2$, $Si_3N_4$, SiC, silicon oxynitride, $Al_2O_3$, organic polymers, and amorphous carbon.

14. The photovoltaic device of claim 8 wherein said layer of semiconductor material comprises a plurality of layers of hydrogenated amorphous silicon of respectively different conductivity types, said layers being arranged in a stacked configuration including a top layer having said first major surface, a bottom layer having said second major surface, and a middle layer interposed between said top and bottom layers, said top and bottom layers being doped with dopants of a first and a second conductivity type, respectively.

15. The photovoltaic device of claim 14 wherein said first and second conductivity types are p-type and n-type, respectively, and the middle layer is intrinsic.

16. The photovoltaic device of claim 14 wherein said first and second conductivity types are n-type and p-type, respectively, and the middle layer is intrinsic.

17. The photovoltaic device of claim 8 wherein said layer of semiconductor material comprises a plurality of photovoltaic cells arranged in a stacked configuration, a top cell of the stack including a top layer having said first major surface, a bottom cell of the stack including a bottom layer having said second major surface, each of said plurality of photovoltaic cells including layers of hydrogenated amorphous silicon of respectively different conductivity types 18. A photovoltaic device, comprising:
- a layer of semiconductor material including at least one semiconductor junction, said semiconductor layer having first and second opposing major surfaces;
- a first optically transmissive electrically conductive contact layer disposed on the first major surface through which incident light enters the semiconductor layer;
- a second optically transmissive electrically conductive contact layer disposed on the second major surface of the semiconductor layer;
- a layer of electrically conductive optically reflective material disposed for reflecting light emanating from said second contact layer substantially back thereto; and
- an optically transmissive intermediate layer, disposed between said second contact layer and said reflective layer for substantially blocking reaction between the second contact layer, and said reflective layer, said optically transmissive intermediate layer having one or more electrically conductive paths therethrough.

19. A method for forming a photovoltaic device, comprising the steps of:
- providing an optically transparent substrate;
- depositing a first optically transmissive electrically conductive contact layer on the substrate;
- depositing on the first contact layer a layer of semiconductor material including a semiconductor junction;
- depositing on the layer of semiconductor material a second optically transmissive electrically conductive contact layer;
- depositing on the second contact layer an optically transmissive intermediate layer including a dielectric material; and
- depositing a layer of electrically conductive optically reflective material on the intermediate layer;
- wherein the intermediate layer is deposited to include portions through which the second contact layer and the optically reflective layer are conductively connected.

20. The method of claim 19, wherein the step of depositing the intermediate layer includes the substep of depositing a thin layer of dielectric material which is discontinuous so as to include openings through which the second contact layer and the optically reflective layer are conductively connected.

21. The method of claim 19, wherein the step of depositing the intermediate layer includes the substep of depositing a cermet layer including at least one metal dispersed in the dielectric material, the dispersed metal defining paths through which the second contact layer and the optically reflective layer are conductively connected.

* * * * *